US012738458B2

(12) United States Patent
Niskanen

(10) Patent No.: US 12,738,458 B2
(45) Date of Patent: Sep. 15, 2026

(54) PROCESSING CHAMBER, ASSEMBLY AND A METHOD

(71) Applicant: ASM IP Holding, B.V., Almere (NL)

(72) Inventor: Antti Niskanen, Helsinki (FI)

(73) Assignee: ASM IP Holding B.V., Almere (NL)

( * ) Notice: Subject to any disclaimer, the term of this patent is extended or adjusted under 35 U.S.C. 154(b) by 665 days.

(21) Appl. No.: 18/059,479

(22) Filed: Nov. 29, 2022

(65) Prior Publication Data

US 2023/0170187 A1 Jun. 1, 2023

Related U.S. Application Data

(60) Provisional application No. 63/284,092, filed on Nov. 30, 2021.

(51) Int. Cl.

*H01J 37/32* (2006.01)
*C23C 16/455* (2006.01)
*C23C 16/458* (2006.01)

(52) U.S. Cl.

CPC .... *H01J 37/3244* (2013.01); *C23C 16/45536* (2013.01); *C23C 16/45544* (2013.01); *C23C 16/45565* (2013.01); *C23C 16/4584* (2013.01); *H01J 37/32715* (2013.01); *H01J 2237/3321* (2013.01); *H01J 2237/3341* (2013.01)

(58) Field of Classification Search

CPC ............. H01J 37/3244; H01J 37/32715; H01J 2237/3321; H01J 2237/3341; C23C 16/45536; C23C 16/45544; C23C 16/45565; C23C 16/4584; C23C 16/45551; C23C 16/52; C23C 16/45525; C23C 16/50; H01L 21/67069; H01L 21/0262

See application file for complete search history.

(56) References Cited

U.S. PATENT DOCUMENTS

| | | | | |
|---|---|---|---|---|
| 9,567,669 | B2 * | 2/2017 | Cho | C23C 16/4412 |
| 2015/0275365 | A1 * | 10/2015 | Pak | C23C 16/4584 427/255.28 |
| 2015/0337442 | A1 * | 11/2015 | Agafonov | C23C 16/45565 118/695 |
| 2022/0243323 | A1 | 8/2022 | Chandrasekharan et al. | |
| 2022/0254612 | A1 | 8/2022 | Kimball et al. | |

FOREIGN PATENT DOCUMENTS

| | | |
|---|---|---|
| TW | M608762 U | 3/2021 |
| TW | 202117071 A | 5/2021 |
| TW | 202121484 A | 6/2021 |

* cited by examiner

*Primary Examiner* — Fernando L Toledo
*Assistant Examiner* — Jorge Andres Lopez
(74) *Attorney, Agent, or Firm* — Banner & Witcoff, Ltd.

(57) ABSTRACT

The current disclosure relates to a semiconductor processing chamber comprising a showerhead, the showerhead comprising a showerplate for providing a reactant into the processing chamber. The processing chamber further comprises a moveable susceptor for holding a substrate; wherein the processing chamber has a showerplate axis extending vertically through the showerplate; a substrate axis extending vertically at a position at which the center of the substrate is configured and arranged to be during providing reactant into the processing chamber; and wherein the substrate axis is offset from the showerhead axis. The disclosure further relates to a semiconductor processing assembly and to a method of treating a semiconductor substrate.

11 Claims, 3 Drawing Sheets

300
Provide substrate in a reaction chamber
301
Position substrate in the reaction chamber so that the centers of substrate and the showerplate do not align vertically
302
Provide reactant to the reaction chamber while rotating the substrate
303

100
30
31
21
31
22
30
31
32
10
30

PROCESSING CHAMBER, ASSEMBLY AND A METHOD

FIELD

The present disclosure relates to methods and assemblies for the manufacture of semiconductor devices. More particularly, the disclosure relates to methods and assemblies for processing semiconductor substrates.

BACKGROUND

In the manufacture of electronic devices, semiconductor substrates, such as silicon wafers, are processed through various process steps to produce the target devices on the substrate. The processing steps include carefully controlled deposition steps to form thin layers of materials in specified areas. The process steps may include vapor deposition processes, such as chemical vapor deposition (CVD), plasma-enhanced CVD (PECVD), atomic layer deposition (ALD), and plasma-enhanced ALD (PEALD). Further, a substrate surface may be cleaned, and material may be etched from the substrate surface. Due to the extremely small dimensions of the devices, care must be taken to maximize the uniformity of deposition or etching, as the case may be, throughout the treated substrate and across different processes.

In many applications, process gases are provided into a processing chamber through a showerhead. The uniformity of gas distribution across the substrate is an important parameter in controlling gas-phase reactors in the processing chamber. In processing chambers configured to perform deposition or etch processes, a substantial thermal differential across the surface of the substrate may result in uneven reactions, such as rate of deposition or etching, respectively. Processing chambers comprising a showerhead, despite having a centrally symmetric design, still show some residual non-uniformity patterns in substrate treatment. This may limit the process development possibilities, particularly in applications in which thin material layers are treated. Thus, there is need in the art for improved processing chambers, assemblies and methods that may provide better gas distribution control for further enhancing uniformity in vapor-phase substrate treatment.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

In one aspect, a semiconductor processing chamber comprising a showerhead and a moveable susceptor for holding a substrate is disclosed. The showerhead comprises a showerplate for providing a reactant into the processing chamber, and the processing chamber has a showerplate axis extending vertically through the showerplate, and a substrate axis extending vertically at a position at which the center of the substrate is configured and arranged to be during providing reactant into the processing chamber. The substrate axis is offset from the showerhead axis.

In some embodiments, the showerplate axis extends vertically through the center of the showerplate. In some embodiments, the substrate axis extends vertically through the susceptor at a position at which the center of the substrate is configured and arranged to be during providing a reactant into the processing chamber.

In some embodiments, the showerplate is an integral part of the showerhead. In some embodiments, the showerplate is detachable from the showerhead.

In some embodiments, the susceptor comprises a susceptor axis extending vertically through the susceptor, and the susceptor is moveable rotatably about the susceptor axis. In some embodiments, the susceptor axis extends vertically through the center of the susceptor. In some embodiments, the susceptor axis extends vertically through the susceptor offset from the center of the susceptor. The susceptor being rotatably moveable about the susceptor axis means that the susceptor moves in a plane perpendicular to the susceptor axis in a rotating movement. The rotating movement may be constant in one direction, or the direction of rotation can be changing.

In some embodiments, the susceptor and the showerplate have a circular shape. In some embodiments, the showerplate axis extends through the center of the susceptor. In some embodiments, the distance between the substrate axis and the showerplate axis is configured to remain constant when a reactant is provided into the processing chamber. In some embodiments, the distance between the substrate axis and the showerplate axis is from 0.1 to 1 times the radius of the showerplate. In some embodiments, the showerplate axis and the susceptor axis coincide.

In some embodiments, the substrate is configured to remain stationary relative to the susceptor during providing a reactant into the processing chamber. In some embodiments, the substrate is configured to rotate relative to the susceptor during providing a reactant into the processing chamber. In some embodiments, the substrate axis and the susceptor axis coincide.

In some embodiments, the processing chamber is a vapor deposition chamber. In some embodiments, the vapor deposition chamber is an ALD chamber. In some embodiments, the processing chamber is configured and arranged to perform a deposition process. In some embodiments, the processing chamber is configured and arranged to perform an etch process. In some embodiments, the deposition chamber is configured and arranged for the deposition of silicon-containing material. The silicon-containing material may be, for example, silicon oxide (e.g. $SiO_2$), SiN, SiC, SiOC, SiON or SiOCN. In some embodiments, the deposition chamber is configured and arranged for the deposition of a metal-containing material, such as a metal oxide, metal nitride metal carbide or a metal phosphide. For example, the metal-containing material may be titanium nitride, titanium oxide, titanium carbide, high k material, such as hafnium oxide, zirconium oxide or aluminum oxide. In some embodiments, the deposition chamber is configured and arranged for a thermal deposition process.

In some embodiments, the processing chamber is an etch chamber.

In another aspect, a substrate processing assembly for treating a semiconductor substrate is disclosed. The assembly comprises a semiconductor processing chamber, wherein the processing chamber comprises a showerhead and a moveable susceptor for holding a substrate is disclosed. The showerhead comprises a showerplate for providing a reactant into the processing chamber and the processing chamber has a showerplate axis extending vertically through the showerplate and a substrate axis extending vertically at a position at which the center of the substrate is configured and arranged to be during providing reactant into the processing chamber. The substrate axis is offset from the showerhead axis.

In a further aspect, a method of treating a semiconductor substrate is disclosed. The method comprises providing a substrate having a center in a processing chamber, providing a reactant in the processing chamber through a circular showerplate having a center; wherein during providing the reactant into the processing chamber, the center of the substrate is at a distance from the plane projection of the center of the showerplate on the substrate and the substrate is rotated.

In some embodiments, the substrate is rotated about the plane projection of the center of the showerplate on the substrate. In some embodiments, the substrate is rotated about its own center.

In some embodiments, the reactant is provided into the processing chamber in vapor phase. In some embodiments, the reactant is a precursor for depositing material on the substrate.

In some embodiments, the precursor is selected from a group consisting of a silicon precursor, a nitrogen precursor, an oxygen precursor, a metal precursor, a metalloid precursor, a transition metal precursor, a rare earth metal precursor and a chalcogen precursor. In some embodiments, the reactant is an etchant.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

Figure 1:
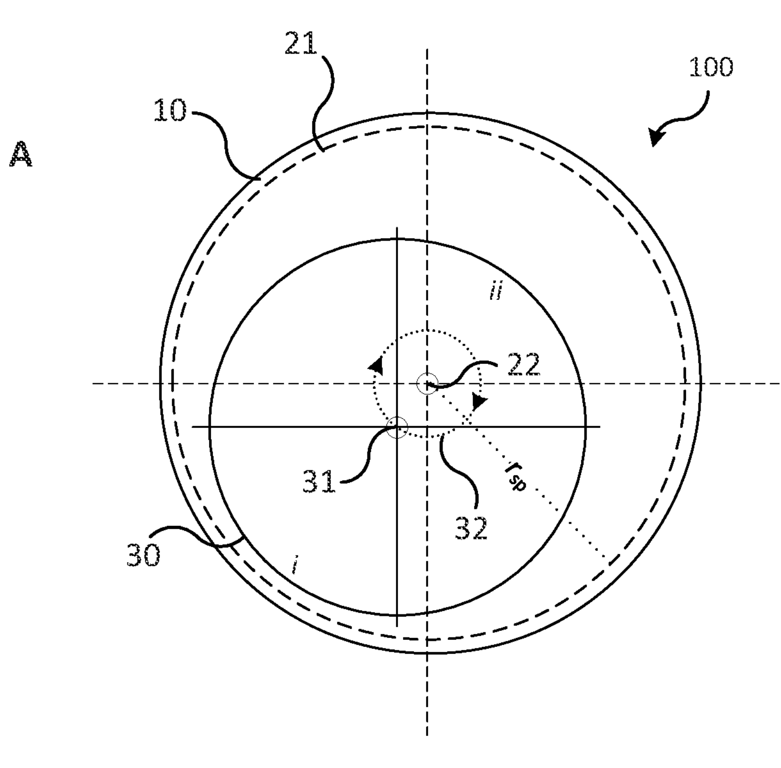
FIG. 1 illustrates an embodiment of a processing chamber according to the current disclosure in a schematic manner.
Figure 1:
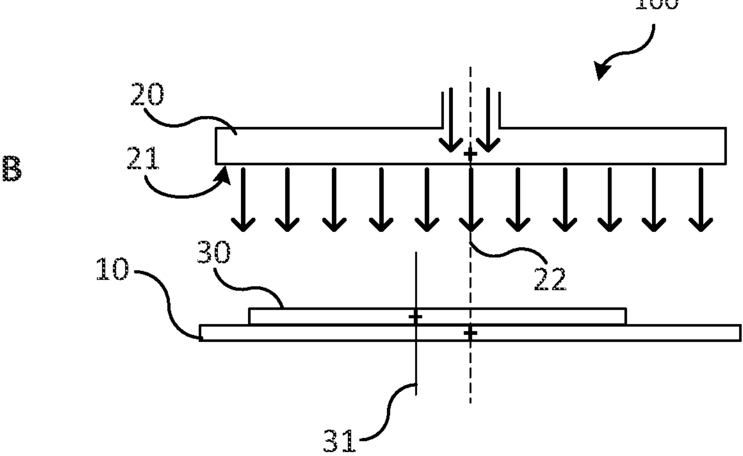

The description of exemplary embodiments of processing chambers, assemblies and methods provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The current disclosure relates to various embodiments of a semiconductor processing chamber, of a substrate processing assembly and of a method of treating a semiconductor substrate. Semiconductor substrates undergo various treatments, such as deposition and etching, in which substances are contacted with the semiconductor substrate surface to bring about reactions forming a semiconductor device. Many of the most advanced techniques, such as atomic layer deposition (ALD), chemical vapor deposition (CVD), and their plasma-enhanced versions (PE-ALD, PE-CVD), as well as dry etch methods, including atomic layer etch (ALEt) use gas-phase delivery of the reactants to the substrate surface.

As used herein, the term "substrate" may refer to any material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers. A substate according to the current disclosure comprises two surfaces having different material properties.

In this disclosure, "gas" can include material that is a gas at normal temperature and pressure (NTP), a vaporized solid and/or a vaporized liquid, and can be constituted by a single gas or a mixture of gases, depending on the context. Precursors according to the current disclosure may be provided to the processing chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments. In etch processes, a reactant takes part in the etching of a target material. For example, ALEt techniques may use two different reactants that together bring about a self-limiting etch of the target material. Only one of them may be etching the target material, but both are needed for a functioning process.

CVD type processes typically involve gas phase reactions between two or more precursors and/or reactants. The precursor(s) and reactant(s) can be provided simultaneously to the reaction space or substrate, or in partially or completely separated pulses.

In some embodiments, cyclic vapor deposition methods are used to deposit material comprising silicon and oxygen. The term "cyclic deposition process" can refer to the sequential introduction of precursor(s) and/or reactant(s) into a processing chamber to deposit material, such as material comprising silicon and oxygen, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. In cyclic CVD processes, the precursors and/or reactants may be provided to the processing chamber in pulses that do not overlap, or that partially or completely overlap. The process may comprise a purge step between providing precursors or between providing a precursor and a reactant in the processing chamber. In cyclic deposition processes, the substrate and/or reaction space can be heated to promote the reaction between the gaseous precursor and/or reactants. Such processes are called thermal deposition processes. In some embodiments the precursor(s) and reactant(s) are provided until a layer having a desired thickness is deposited The term "atomic layer deposition" (ALD) can refer to a vapor deposition process in which deposition cycles, such as a plurality of consecutive deposition cycles, are conducted in a processing chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a processing chamber and is chemisorbed to a deposition surface (e.g., a substrate surface that may include a previously deposited material from a previous ALD cycle or other material), forming about a monolayer or submonolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the processing chamber. Thus, in some embodiments, the cyclic deposition process comprises purging the processing chamber after providing a precursor or a reactant into the processing chamber.

In some embodiments, the chamber according to the current disclosure is constructed and arranged for plasma-enhanced processes, such as plasma-enhanced ALD (PEALD) or plasma-enhanced CVD (PECVD). In such processes, plasma is provided into the processing chamber to form a reactive species for driving reactions either in gas phase or on the substrate surface. In some embodiments, plasma may be formed remotely via plasma discharge ("remote plasma") away from the substrate or reaction space. In some embodiments, plasma may be formed in the vicinity of the substrate or directly above substrate ("direct plasma"). In some embodiments, the plasma is produced by gas-phase ionization of a gas with a radio frequency (RF) power. In some embodiments, the plasma is produced by gas-phase ionization of a gas with microwave radiation. In some embodiments, the chamber according to the current disclosure is constructed and arranged for plasma-enhanced processes, such as radical-enhanced ALD (REALD).

In some embodiments, the processing chamber according to the current disclosure, and the method according to the current disclosure, relate to etching a material from the substrate surface. In a "regular", continuous, etch process, an etchant compound is provided into the processing chamber to remove material. In some embodiments, an etch process comprises the continuous flow of at least one reactant. In some embodiments, one or more of the reactants are provided in the processing chamber continuously.

In some embodiments, an etch process is a cyclic etch process. For example, etching may comprise providing two reactants alternatively and sequentially into the processing chamber. In some embodiments, an etch process comprises an atomic layer etch (ALEt) process. In ALEt, thin layers of material are controllably removed using sequential reaction steps. In some embodiments, the sequential reaction steps are self-limiting. In contrast to conventional continuous etch, ALEt typically utilizes one or more etch cycles to remove material. One or more etch cycles may be provided in an ALEt process.

A processing chamber according to the current disclosure can form part of an atomic layer deposition (ALD) assembly. The processing chamber can form part of a chemical vapor deposition (CVD) assembly. The processing chamber can form part of an atomic layer etch (ALEt) assembly. The reactor may be a single wafer reactor. Alternatively, the reactor may be a batch reactor. The assembly may comprise one or more multi-station deposition chambers. Optionally, an assembly including the processing chamber can be provided with a heater to activate the reactions by elevating the temperature of the substrate and/or the reactants and/or precursors. Alternatively or in addition to, an assembly including the processing chamber can be provided with a plasma source to activate the reactions by providing reactive species (such as radicals and/or ions) into the processing chamber.

The processing chamber according to the current disclosure is a showerhead-type processing chamber. In showerhead-type processing chambers, the gas distribution system may include a showerhead assembly for distributing gas(es) to a surface of the substrate. The showerhead assembly may be located above the substrate. During substrate processing, one or more reaction gases flow from the showerhead assembly in a downward direction towards the substrate and then outward over the substrate, towards the edge of the substrate. For example, a showerhead assembly may comprise a showerplate having a chamber side and a distribution side, and a showerhead chamber adjacent to the chamber side of the showerplate and a plurality of apertures spanning the showerplate between the chamber side and the distribution side of the showerplate. The distribution side of the showerplate is constructed and arranged to face a substrate positioned in the processing chamber.

The disclosure is further explained by the following exemplary embodiments depicted in the drawings. The illustrations presented herein are not meant to be actual views of any particular processing chamber, a processing chamber component or a material layer, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

Figure 3:
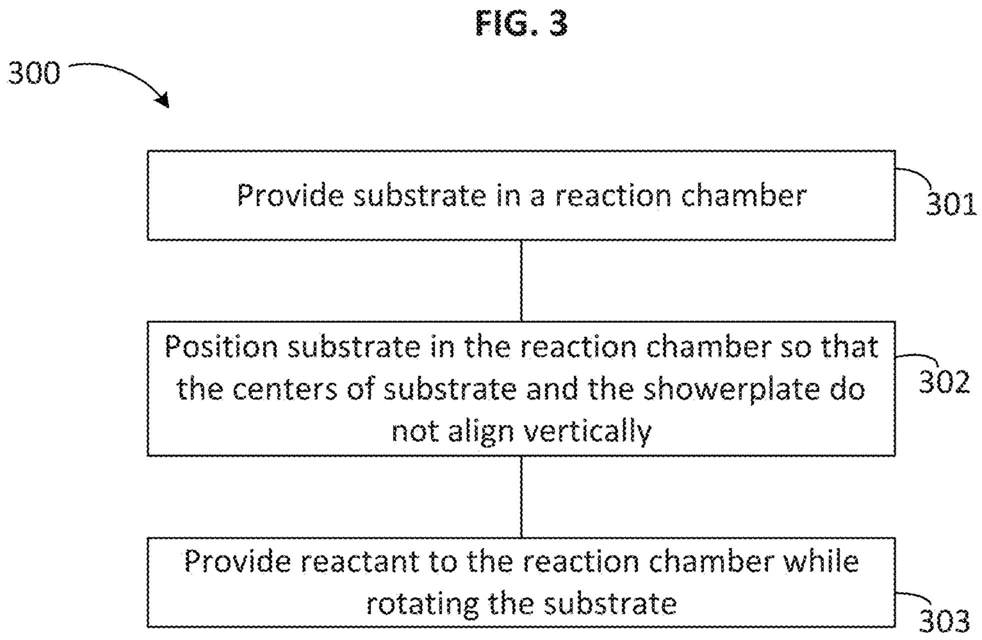
FIG. 3 illustrates an embodiment of a method according to the current disclosure.

The following numbering will be used throughout the drawings:

100—processing chamber
10—susceptor
11—susceptor axis
20—showerhead
21—showerplate
22—showerplate axis
30—substrate
31—substrate axis
32—path of substrate center during treating the substrate
300 to 303—process steps (FIG. 3)

FIG. 1 illustrates an exemplary embodiment of a semiconductor processing chamber 100 according to the current disclosure. The semiconductor processing chamber 100 comprises a showerhead 20 comprising a showerplate 21 for providing a reactant into the processing chamber, and a moveable susceptor 10 for holding a substrate 30. The processing chamber 100 has a showerplate axis 22 extending vertically through the showerplate 21 and a substrate axis 31 extending vertically at a position at which the center of the substrate 30 is configured and arranged to be during providing reactant into the processing chamber 100. In some embodiments, the showerplate axis 22 extends through the center of the showerplate 21. In the processing chamber 100 according to the current disclosure, the substrate axis 31 is offset from the showerhead axis 22.

Panel A of FIG. 1 depicts a processing chamber 100 as a schematic top view. The susceptor 10 is depicted as the largest circle. The position of the showerplate 21 is depicted with a dashed circle. The showerplate 21 is above the plane of viewing, so the dashed circle represents the plane projection of the showerplate 21 on the susceptor 10 surface. The showerplate 21 comprises apertures for providing reactants into the processing chamber 100, but they are not visible in panel A. In the embodiment of FIG. 1, both the susceptor 10 and the showerplate 21 have a circular shape.

In the embodiment of FIG. 1, panel A, the surface area of the showerplate 21 is slightly smaller than the area of the susceptor. However, in some embodiments, the surface area of a the showerplate 21 is equal to that of the susceptor. In some embodiments, the surface area of a the showerplate 21 is larger than that of the susceptor. The radius of the showerplate is indicated with a dotted line ($r_{sp}$).

The substrate—such as a semiconductor wafer—is depicted by the circle 30. The substrate axis is indicated by the solid cross 31. As explained above, the substrate may be any semiconductor substrate, and targeted for any processing used during the manufacture of semiconductor devices, such as deposition of material, or etching of material. The substrate 30 is offset relative to the showerhead axis 22 and to the susceptor 10. The showerplate axis 22 is indicated with a dashed cross 22. As the showerplate 21 and the susceptor 10 are positioned concentrically, the showerplate axis 22 extends through the center of the susceptor 10. Thus, the showerplate axis 22 and the susceptor axis coincide.

In the figure, the susceptor 10 comprises a susceptor axis extending vertically through the susceptor. In some embodiments, the susceptor axis extends vertically through the center of the susceptor 10. However, for example, if the susceptor has a non-circular shape, the axis may be positioned elsewhere than in the center of the susceptor plane. In FIG. 1, panel A, the susceptor axis extends through the center of the susceptor 10. Since the susceptor 10 and the showerplate 21 are positioned concentrically, the showerplate axis 22 also indicates the position of the susceptor axis (not shown in the figure).

The susceptor 10 according to the current disclosure is moveable. Moving the susceptor 10 may allow to alleviate position effects on the substrate 30 treatment. In FIG. 1, panel A, the susceptor is moveable rotatably about the susceptor axis. Thus, the distance between the substrate axis 31 and the showerplate axis 22 is configured to remain constant when a reactant is provided into the processing chamber 100.

In other words, the susceptor rotates horizontally, i.e. perpendicular to the susceptor axis. The dotted circle 32 indicates the path that the substrate axis 31 follows when the susceptor 10 is rotated about the susceptor axis (at an identical position with the showerplate axis 22). Rotating may be performed in one direction, or the direction of rotation can be alternated. Moving the susceptor may reduce the effects that the showerplate apertures have on the uniformity of reactions across the substrate. In some embodiments, the substrate 30 is configured to remain stationary relative to the susceptor 10 during providing a reactant into the processing chamber.

It may be beneficial to alter the distance of a given position on the substrate 30 relative to the edge of the susceptor 10 and/or showerplate 21. Thus, simply rotating a substrate 30 about a common center of the susceptor 10 and showerplate 21 may not be sufficient in all situations. Improvements may be achieved when the center of the substrate 31 is positioned offset relative to the center of the showerplate 21. In some embodiments, the susceptor may be tilted vertically, such that when the susceptor is rotated, the distance of the substrate surface from the showerplate will change. In some embodiments, the susceptor may be tilted from about 1° (degrees) to about 5°, such as about 2° or about 3°.

When positioning the substrate 30 so that its center is offset to the center of the showerplate 21, the position of the substrate 30 on a susceptor 10 may vary, depending on the relative sizes and positions of the showerplate 21 and the susceptor 10. For example, if the substrate 30 rotates about its own axis 31 while the susceptor 10 is rotating about the shared susceptor and showerplate axis 22, the distance of susceptor positions relative to the showerhead edge will change during the movement of the susceptor 10. In some embodiments, the substrate 30 is configured to rotate relative to the susceptor 10 during providing a reactant into the processing chamber 100.

This is exemplified in FIG. 1, panel A by the two positions i and ii on the substrate 30. Both positions are at the same distance from the substrate 30 edge. However, in the position depicted in FIG. 1, panel A, position i is closer to the edge of the showerplate 21 than position ii. Thus, the two positions would be momentarily subjected to different positional effects of the processing performed in the processing chamber. If the substrate 30 is stationarily fixed to the susceptor 10, positions i and ii will remain at their fixed distances from the susceptor 10—and thus the showerplate 21—edge. However, if the susceptor is moved in a pattern other than circular about the showerplate axis 22, such as reciprocal, the distance to showerplate 21 edge may change. As a further option, the substrate may rotate about its own axis 31 during the susceptor 10 rotation about the showerhead axis 22. This will cause the location of the positions i and ii relative to the showerplate 21 to change. This way, any positional effects that may be relative to the distance from the showerplate 21 or susceptor 10 edge or to the showerplate, 21 apertures may vary during the treatments, which may reduce the difference in the effects of the treatment in different positions.

Further, the distance from the substrate 30 edge may cause edge effects that may be at least partially independent of the positional effects caused by the position relative to the showerplate 21. These edge effects may be in part caused by the vicinity of processing chamber 100 walls. The rotation of the substrate 30 about its own axis may help to reduce non-uniformities caused by these effects. Additionally, downstream effects of deposition (reaction by-products etc.) are also evened out as the wafer edges are at times closer to the showerhead center (receive less downstream effects) and sometimes closer to the showerhead edge (receive more downstream effects).

In some embodiments, the distance between the substrate axis 31 and the showerplate axis 22 is from 0.1 to 0.5 times the radius of the showerplate. For example, in the embodiment of FIG. 1, panel A the distance between the substrate axis 31 and the showerplate axis 22 is about 0.25 times the radius ($r_{sp}$) of the showerplate 21. In some embodiments, the distance between the substrate axis 31 and the showerplate axis 22 is about 0.2, 0.3 or 0.4 times the radius ($r_{sp}$) of the showerplate 21.

FIG. 1, panel B depicts the exemplary embodiment of a processing chamber 100 of FIG. 1, panel A as a schematic side view. As the processing chamber is a part of a deposition assembly, which is has a fixed position, the processing chamber is depicted in its regular orientation, i.e. directions up and down are used in the current disclosure to indicate the directions when the processing assembly is in its using position. The processing chamber 100 is formed into a space limited, in their part, the showerplate 21 of the showerhead 20. Other enclosing features, such as walls, seal rings and the like are omitted from the figure for clarity. The susceptor 10 forms at least a part of the processing chamber bottom, and the substrate 30 is positioned thereon. In the sideview, the gas flow is schematically presented by downward-facing arrows. The process gases are provided into the processing chamber 100 through conduits internal to the showerhead. The gases flow from the showerplate 21 through apertures (not drawn) downwards towards the substrate (30). Due to the showerhead geometry, the gases flow towards the edges of the substrate 30 substantially symmetrically.

The centers of the substrate 30, susceptor 10 and the showerplate 21 are indicated by small crosses. As depicted in FIG. 1B, the showerplate axis 22 extends vertically through the center of the showerplate 21 and the susceptor 10, whereas the center of the substrate 30 is offset from this axis 22.

In some embodiments, the processing chamber 100 is configured and arranged to perform a deposition process. The processing chamber 100 may be a vapor deposition chamber. In some embodiments, the vapor deposition chamber is an ALD chamber. A rotating susceptor according to the current disclosure may have advantages in processes in which it is not possible to raise the temperature of the susceptor edge. Such situations may occur, for example, if the substate comprises pre-deposited layers with a limited thermal budget. In some embodiments, the processing chamber 100 is an etch chamber. In an aspect, the current disclosure relates to a substrate processing assembly for treating a semiconductor substrate. The assembly comprises a semiconductor processing chamber according to the current disclosure.

In some embodiments, a susceptor may be configured and arranged for multiple substrates. For example, the susceptor may comprise positions for two, three or four substrates. The positions for substrates may be symmetrically arranged on the susceptor.

Figure 2:
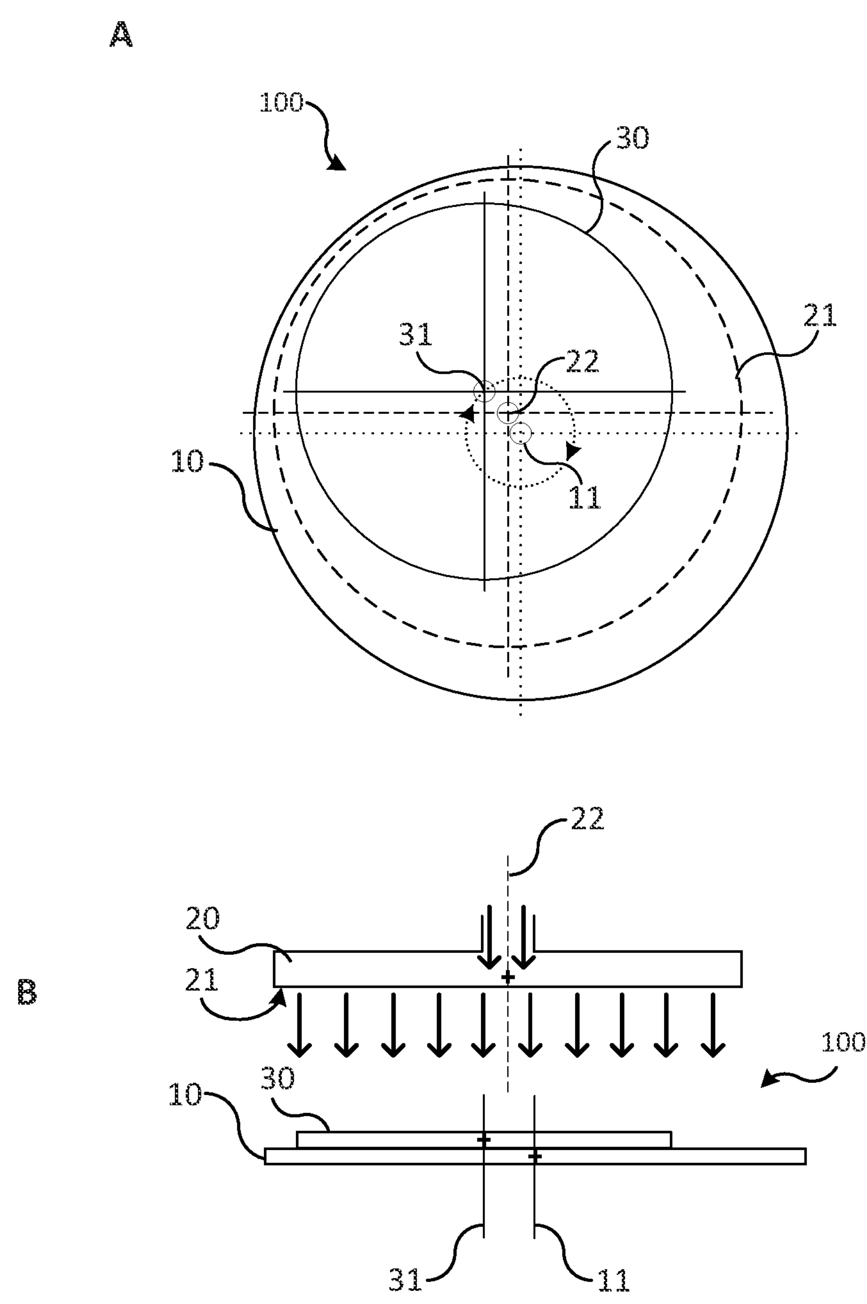
FIG. 2 depicts illustrates another embodiment of a processing chamber according to the current disclosure in a schematic manner.

FIG. 2 illustrates another exemplary embodiment of a processing chamber 100 according to the current disclosure. In the embodiment of FIG. 1, the susceptor 10 is positioned concentrically relative to the showerplate 21. However, the susceptor 10 may be positioned asymmetrically relative to the showerplate 21, as in the embodiment of FIG. 2. In such embodiments, the substrate axis 31 and the susceptor axis 11 may coincide, and the offset between the substrate axis 31 to the showerplate axis 22 is still retained. In some embodiments, none of the susceptor 10, the showerplate 21 and the substrate 30 are positioned concentrically.

FIG. 2, panel A depicts an exemplary processing chamber 100 from above in a schematic form. As in FIG. 1, the largest circle indicates the susceptor 10, and the position of the showerplate 21 above the susceptor 10 and the substrate 30 is indicated by a dashed circle 21. As in the embodiment of FIG. 1, the showerplate axis 22 and the substrate axis 31 are offset from each other. However, in the embodiment of FIG. 2, the showerplate 21 and the susceptor 10 are not arranged concentrically. The susceptor 10 comprises a susceptor axis 11 (dotted cross) extending vertically through the susceptor 10. In this embodiment, the susceptor axis 11 extends through the center of the susceptor 10. Due to the arrangement of the showerplate 21 and the susceptor 10, the showerplate axis 22 and the susceptor axis do not coincide.

Further, the substrate 30 is not arranged concentrically relative to either of the susceptor 10 and the showerplate 21. Thus, when the susceptor 10 is rotated about the susceptor axis, the substrate axis 31 moves relative to the showerplate 21 (dotted circular arrow). Due to the non-concentrical arrangement of the showerplate 21, the susceptor 10 and the substrate 30, the location of different positions on the substrate 30 (similar to positions i and ii in FIG. 1) relative to the showerplate 21 will change during the movement of the susceptor 10.

FIG. 2, panel B depicts the embodiment of FIG. 2, panel A from the side. The centers of susceptor 10, showerplate 21 and substrate 30 are depicted with a cross, and their respective axes 11, 22 and 31 are indicated with vertical lines. Each of the axes is at a different horizontal position, bringing about the varying positioning of the substrate 30 relative to the showerplate 21. Vertical arrows indicate the flow of process gases, such as reactants.

FIG. 3 is a block diagram of an embodiment of a method 300 according to the current disclosure. In the figure, a method of treating a semiconductor substrate is displayed. The method comprises, first, providing a substrate having a center in a processing chamber at block 301. Thereafter, the method comprises providing a reactant into the processing chamber through a circular showerplate having a center at block 302. During providing the reactant into the processing chamber, the center of the substrate is at a distance from the plane projection of the center of the showerplate on the substrate and the substrate is rotated at block 303.

The method according to the current disclosure may allow the intended reactions to be performed more evenly over the substrate. For example, the effects of showerplate apertures, or of the accumulation of reaction by-products may be reduced. Providing a reactant according to the current method may mean providing a single reactant, such as in the case of continuous etch. Alternatively, two or more reactants may be provided into the reaction chamber, as is done in ALD or ALEt. A reactant may mean plasma, or even a purging gas.

The rotation speed of the substrate may vary depending on the application. In some embodiments, the substrate is rotated by at least one full circle during the time a reactant is provided into the processing chamber (the reactant pulse). In some embodiments, the substrate is rotated less than a full circle during a reactant pulse. In some embodiments, the susceptor is rotated by at least one full circle during a reactant pulse. In some embodiments, the susceptor is rotated less than a full circle during a reactant pulse. In some embodiments, the direction of rotation is alternated. In some embodiments, the substrate is rotated from about 1° per pulse to about 360° per pulse, such as from 5° to 15° per pulse. In continuous deposition processed (i.e. in which the reactants are not provided in pulses), such as CVD, the rotation speed may be adjusted based on the growth rate of the deposited material. For example, the substrate may be rotated from 1 to 2 full circles for each nanometer of material deposited. In some embodiments, this may be expressed pre unit time, such as from 1 to 2 full circles per minute.

In some embodiments, the substrate is rotated about the plane projection of the center of the showerplate on the substrate. In some embodiments, the substrate is rotated about its own center. In some embodiments, the reactant is provided into the processing chamber in vapor phase. In some embodiments, the reactant is a precursor for depositing material on the substrate. In some embodiments, the precursor is selected from a group consisting of a silicon precursor, a nitrogen precursor, an oxygen precursor, a metal precursor, a metalloid precursor, a transition metal precursor, a rare earth metal precursor and a chalcogen precursor. In some embodiments, the precursor is a silicon precursor. In some embodiments, the precursor is a nitrogen precursor. In some embodiments, the precursor is an oxygen precursor.

In some embodiments, the precursor is a metal precursor. In some embodiments, the precursor is a transition metal precursor. In some embodiments, the precursor is a metalloid precursor. In some embodiments, the precursor is a rare earth metal precursor. In some embodiments, the reactant is an etch reactant. In some embodiments, the etch reactant is a halogen-containing reactant. In some embodiments, the etch reactant is a fluorine-containing reactant. In some embodiments, the etch reactant is a chlorines-containing reactant.

Figure 4:
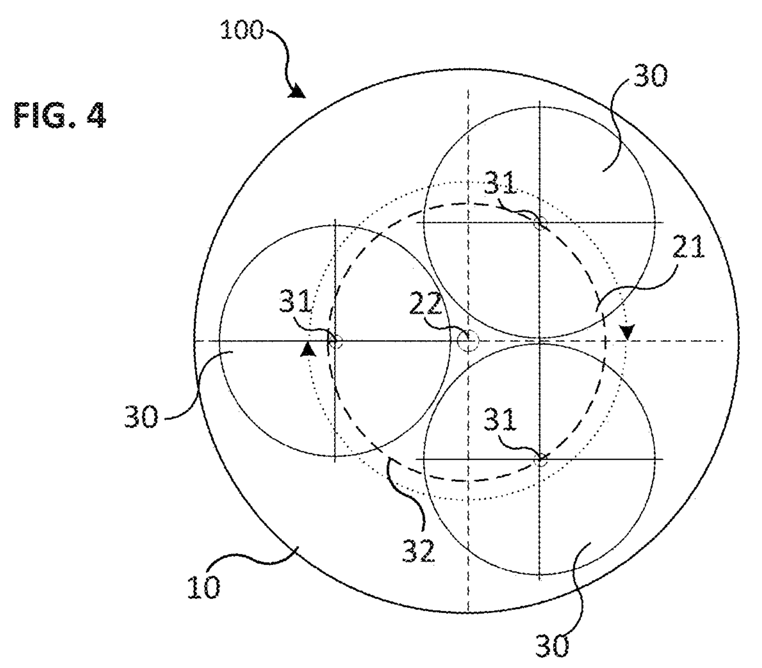
FIG. 4 illustrates an embodiment of a processing chamber according to the current disclosure as a schematic top view.

FIG. 4 illustrates a processing chamber 100 similar to the one presented in FIG. 1. The susceptor 10 and the showerplate 21 are positioned concentrically. However, in the embodiment of FIG. 4, the susceptor 10 accommodates three substrates 30. The rotating direction of the susceptor is indicated with a dotted circular arrow. Each substate 30 has a substrate axis 31, and the substrate axis 31 is offset from the showerplate axis 22. In the embodiment of FIG. 4, the distance of the substrate axis 31 from the showerplate axis 22 is approximately equal (1) to the radius of the showerplate 30.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A semiconductor processing chamber comprising
- a showerhead comprising a showerplate for providing a reactant into the processing chamber; and
- a moveable susceptor for holding a substrate,
- wherein the processing chamber has
  - a showerplate axis extending vertically through the showerplate; and
  - a substrate axis extending vertically at a position at which the center of the substrate is configured and arranged to be during providing reactant into the processing chamber,
- wherein the substrate axis is offset from the showerplate axis,
- wherein the susceptor comprises a susceptor axis that extends through the susceptor, and the susceptor is moveable rotatably about the susceptor axis while being tilted relative to the showerplate axis such that the distance of a surface of the substrate from the showerplate changes during rotation, and
- wherein the substrate axis and the susceptor axis coincide.

2. The semiconductor processing chamber of claim 1, wherein the susceptor is tilted relative to the showerplate axis from about 1° to about 5°.

3. The semiconductor processing chamber of claim 1, wherein the susceptor and the showerplate have a circular shape.

4. The semiconductor processing chamber of claim 1, wherein the showerplate axis extends through the center of the susceptor.

5. The semiconductor processing chamber of claim 2, wherein the susceptor is tilted relative to the showerplate axis from about 2° or about 3°.

6. The semiconductor processing chamber of claim 1, wherein the distance between the substrate axis and the showerplate axis is from 0.1 to 1 times the radius of the showerplate.

7. The semiconductor processing chamber of claim 1, wherein the substrate is configured to rotate relative to the susceptor during providing a reactant into the processing chamber.

8. The semiconductor processing chamber of claim 1, wherein the processing chamber is a vapor deposition chamber.

9. The semiconductor processing chamber of claim 8, wherein the vapor deposition chamber is an ALD chamber.

10. The semiconductor processing chamber of claim 1, wherein the processing chamber is an etch chamber.

11. A substrate processing assembly for treating a semiconductor substrate, the assembly comprising a semiconductor processing chamber according to claim 1.

* * * * *